United States Patent
Lee et al.

(10) Patent No.: US 8,455,923 B2
(45) Date of Patent: Jun. 4, 2013

(54) EMBEDDED NOR FLASH MEMORY PROCESS WITH NAND CELL AND TRUE LOGIC COMPATIBLE LOW VOLTAGE DEVICE

(75) Inventors: Peter Wung Lee, Saratoga, CA (US); Han-Rei Ma, Mountain View, CA (US); Fu-Chang Hsu, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 0 days.

(21) Appl. No.: 13/135,220

(22) Filed: Jun. 29, 2011

(65) Prior Publication Data
US 2012/0001233 A1   Jan. 5, 2012

Related U.S. Application Data

(60) Provisional application No. 61/398,964, filed on Jul. 1, 2010.

(51) Int. Cl.
*H01L 27/118* (2006.01)

(52) U.S. Cl.
USPC ........... 257/202; 257/314; 257/368; 257/390; 257/499; 257/506; 257/E27.102; 257/E27.103; 257/E27.104

(58) Field of Classification Search
USPC .................. 257/202, 314, 368, 390, 499, 506, 257/E27.102, E27.103, E27.104
See application file for complete search history.

(56) References Cited

U.S. PATENT DOCUMENTS

| | | | |
|---|---|---|---|
| 6,272,050 B1 | 8/2001 | Cunningham et al. | |
| 6,368,918 B2 | 4/2002 | Cunningham et al. | |
| 6,909,139 B2 | 6/2005 | Shum et al. | |
| 6,927,450 B2 * | 8/2005 | Nishizaka et al. | 257/324 |
| 7,087,953 B2 * | 8/2006 | Lee | 257/315 |
| 7,177,190 B2 | 2/2007 | Lee | |
| 7,190,022 B2 * | 3/2007 | Shum et al. | 257/316 |
| 7,315,603 B2 * | 1/2008 | Iwase et al. | 376/233 |
| 7,436,028 B2 * | 10/2008 | Yang et al. | 257/368 |

(Continued)

OTHER PUBLICATIONS

"Highly Scalable Embedded Flash Memory With Deep Trench Isolation and Novel Buried Bitline Integration for the 90-nm Node and Beyond," by Armin T. Tilke et al., IEEE Transactions on Electron Devices, vol. 54, No. 7, Jul. 2007, pp. 1681-1688, found May 25, 2011: http://ieeexplore.ieee.org/search/srchabstract.jsp?tp=&arnumber=425....

(Continued)

*Primary Examiner* — Ida M Soward
(74) *Attorney, Agent, or Firm* — Saile Ackerman LLC; Stephen B. Ackerman; Billy Knowles

(57) ABSTRACT

An integrated circuit formed of nonvolatile memory array circuits, logic circuits and linear analog circuits is formed on a substrate. The nonvolatile memory array circuits, the logic circuits and the linear analog circuits are separated by isolation regions formed of a shallow trench isolation. The nonvolatile memory array circuits are formed in a triple well structure. The nonvolatile memory array circuits are NAND-based NOR memory circuits formed of at least two floating gate transistors that are serially connected such that at least one of the floating gate transistors functions as a select gate transistor to prevent leakage current through the charge retaining transistors when the charge retaining transistors is not selected for reading. Each column of the NAND-based NOR memory circuits are associated with and connected to one bit line and one source line.

66 Claims, 12 Drawing Sheets

U.S. PATENT DOCUMENTS

| | | | |
|---|---|---|---|
| 7,629,812 B2* | 12/2009 | Thummalapally et al. | 326/38 |
| 7,638,835 B2* | 12/2009 | Irani et al. | 257/324 |
| 7,687,347 B2 | 3/2010 | Shum et al. | |
| 7,842,990 B2* | 11/2010 | Kang | 257/296 |
| 8,069,377 B2* | 11/2011 | Singh | 714/711 |
| 8,080,842 B2* | 12/2011 | Lee | 257/314 |
| 2004/0232497 A1* | 11/2004 | Akiyama et al. | 257/390 |
| 2006/0125024 A1* | 6/2006 | Ishigaki | 257/390 |
| 2008/0093677 A1* | 4/2008 | Kim et al. | 257/390 |
| 2008/0143423 A1* | 6/2008 | Komatsu et al. | 327/534 |
| 2008/0237700 A1* | 10/2008 | Kim et al. | 257/326 |
| 2008/0283935 A1* | 11/2008 | Sridhar et al. | 257/390 |
| 2009/0001481 A1* | 1/2009 | Cannon et al. | 257/390 |
| 2009/0279360 A1 | 11/2009 | Lee et al. | |
| 2009/0310405 A1 | 12/2009 | Lee et al. | |
| 2009/0310411 A1 | 12/2009 | Lee et al. | |
| 2009/0310414 A1 | 12/2009 | Lee et al. | |
| 2009/0316487 A1 | 12/2009 | Lee et al. | |
| 2011/0164808 A1* | 7/2011 | Laisne et al. | 382/149 |

OTHER PUBLICATIONS

"Nonvolatile Memory Technologies With Emphasis on Flash, A Comprehensive Guide to Understanding and Using NVM Devices," Edited by Joe E. Brewer et al., Wiley-Interscience, A John Wiley & Sons, Inc. Publication, IEEE Press (c) 2008, pp. 373-405.

* cited by examiner

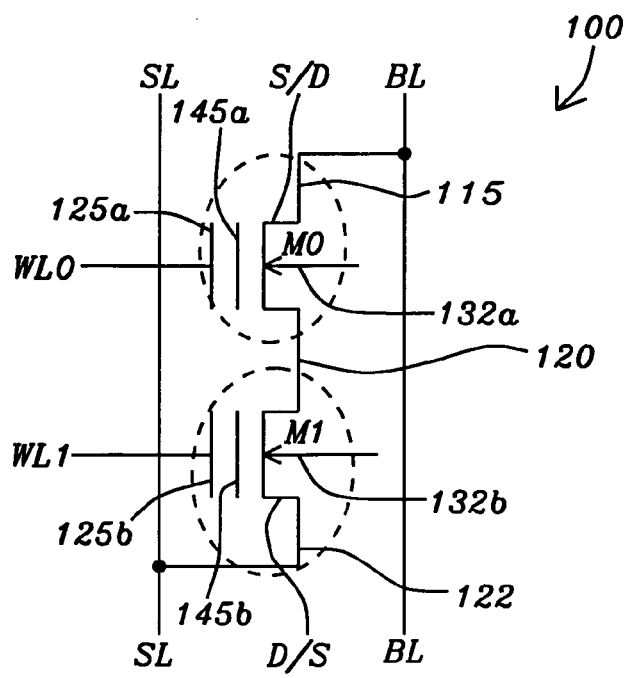
FIG. 1a
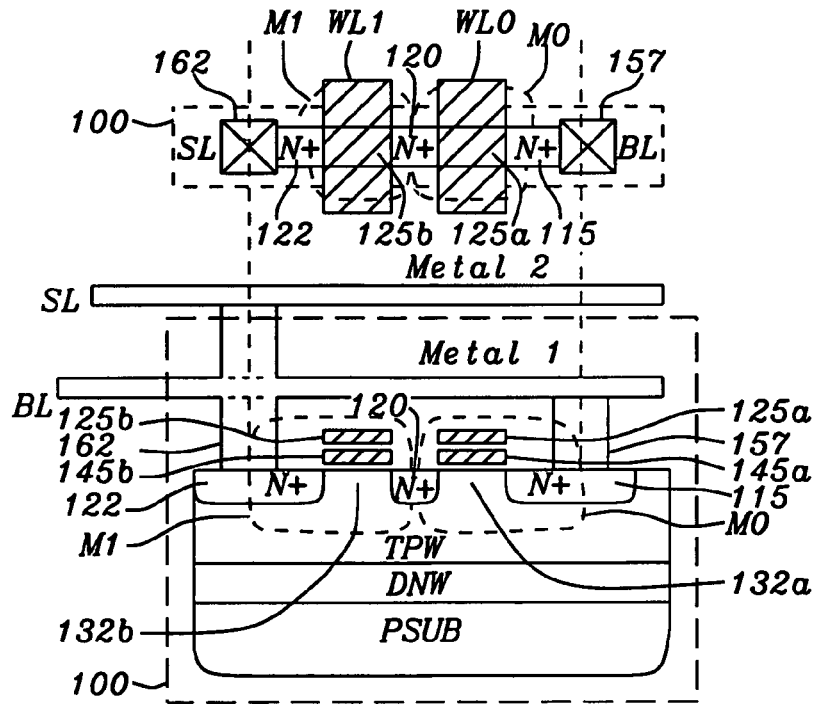
FIG. 1b-1
FIG. 1b-2

EMBEDDED NOR FLASH MEMORY PROCESS WITH NAND CELL AND TRUE LOGIC COMPATIBLE LOW VOLTAGE DEVICE

This application claims priority under 35 U.S.C. §119 to U.S. Provisional Patent Application Ser. No. 61/398,964, filed on Jul. 1, 2010, assigned to the same assignee as the present invention, and incorporated herein by reference in its entirety.

RELATED PATENT APPLICATIONS

U.S. patent application Ser. No. 12/387,771 (771), filed on May 7, 2009 assigned to the same assignee as the present invention, and incorporated herein by reference in its entirety.

U.S. patent application Ser. No. 12/455,337, filed on Jun. 1, 2009 assigned to the same assignee as the present invention, and incorporated herein by reference in its entirety.

U.S. patent application Ser. No. 12/455,936, filed on Jun. 9, 2009 assigned to the same assignee as the present invention, and incorporated herein by reference in its entirety.

U.S. patent application Ser. No. 12/456,354, filed on Jun. 16, 2009 assigned to the same assignee as the present invention, and incorporated herein by reference in its entirety.

U.S. patent application Ser. No. 12/456,744, filed on Jun. 22, 2009 assigned to the same assignee as the present invention, and incorporated herein by reference in its entirety.

BACKGROUND OF THE INVENTION

1. Field of the Invention

This invention relates generally to integrated circuits and to processes for manufacturing integrated circuits. More particularly, this invention relates to nonvolatile flash memory circuits fabricated with logic and linear circuits as a system-on-chip (SoC) and to processes for manufacturing nonvolatile flash memory circuits fabricated with logic and linear circuits as a system-on-chip (SoC).

2. Description of Related Art

As is known in the art, Flash nonvolatile memory is a solid-state memory technology that is widely used in many applications such as consumer cell phones and personal digital assistants to provide permanent data storage. The NAND Flash and NOR Flash memory have emerged as the dominant varieties of non-volatile semiconductor memories. The NAND Flash memory has a very small cell size and is used primarily as a high-density data storage medium. Alternately, the NOR Flash has approximately one quarter the density of the NAND flash memory and is typically used for program code storage and direct execution. The advantages of the NAND flash are higher memory density and thus lower bit cost, relatively fast write speed, and lower active power. The advantages of the NOR flash memory are relatively fast read speed and random access to provide ease of access for executing programming code.

NOR flash memory cells suffer from a punch-through phenomenon of the MOS charge retaining transistors for present advanced integrated circuit manufacturing technology nodes. Punch-through is caused when drain and source depletion regions merge, if a sufficiently large reverse bias is applied. This occurs with MOS transistors with very short channel lengths. The energy barrier that keeps the electrons in the source region of an NMOS transistor is lowered when the drain and source depletion merge. In this instance many electrons start to flow from the source to the drain even when the gate voltage is below the threshold voltage level of the NMOS transistor and the NMOS transistor is not supposed to conduct. This leakage current is sufficient large to cause the consumption of a relatively large amount of power during programming. The MOS charge retaining transistors are designed to have a channel length that is sufficiently large to prevent the punch-through.

The NAND flash memory cell is structured to have a serial NAND string with a gating transistor overcomes this scaling problem and is in mass production at the present advanced integrated circuit manufacturing technology minimum feature size of approximately 19 nm. However, NAND flash memory has a relatively slow read speed and is thus not suitable for an embedded application. While there are embedded NAND and NOR flash memory designs, there is no true embedded flash memory technology that is available for mass production in the semiconductor industry that has low power consumption to meet the requirement of "Green Memory". Nonetheless, the demand for an integrated circuit process capable of having a NAND and NOR flash nonvolatile memory is increasing, because more and more System-on-Chip (SoC) integrated circuits are required with the embedded flash memory designs.

SUMMARY OF THE INVENTION

An object of this invention is to provide circuits and methods of manufacture of integrated circuits combining nonvolatile memory circuits with logic and linear analog circuits.

To accomplish at least this object, an integrated circuit is formed on a substrate. The integrated circuit is formed of nonvolatile memory array circuits, logic circuits and linear analog circuits. The nonvolatile memory array circuits, the logic circuits, and the linear analog circuits are each formed in active semiconductor areas separated by isolation regions formed with a shallow trench isolation. The nonvolatile memory array circuits are formed in a triple well structure where a first deep well is formed of a first conductivity type such as a diffusion with an N-type impurity and a second well is formed of a second conductivity type where the second well such as a diffusion of a P-type impurity.

The nonvolatile memory array circuits are constructed of rows and columns of NAND or NOR charge retaining cells formed within designated active areas. The NOR charge retaining cells are NAND-based NOR memory cells having at least two floating gate transistors serially connected such that at least one of the floating gate transistors functions as a select gate transistor to prevent leakage current through the charge retaining transistors when the charge retaining transistors is not selected for reading. The nonvolatile memory array circuits formed of NAND-based NOR charge retaining cells has a column of the NAND-based NOR charge retaining cells with a bit line and source line associated with each column of the NAND-based NOR charge retaining cells. A drain of the topmost charge retaining transistor is connected to the bit line associated with and parallel to each of the columns of serially connected NAND-based NOR charge retaining cells. Similarly, a source of the bottommost charge retaining transistor is connected to the source line associated with and parallel to each of the columns of NAND-based NOR charge retaining cells and parallel to the associated bit line. A control gate of each of the rows of NAND-based NOR flash memory cells is connected to a word line.

The active areas for peripheral circuitry of the nonvolatile memory array circuits, the logic circuits, and the linear circuits have a shallow well of the first conductivity type and a shallow well of the second conductivity type into which the low voltage logic devices are fabricated. The shallow well of the first conductivity type is an N-well and the shallow well of the second conductivity type is a P-well. PMOS transistors are formed in the N-well and NMOS transistors are formed in the P-well.

High voltage MOS transistors are formed in the substrate. To establish the appropriate threshold, ion implantation is performed at the channel regions of the high voltage MOS transistors. One ion implantation operation sets the threshold for a high voltage MOS transistor with a standard threshold voltage. A second ion implantation operation sets the threshold for a zero threshold high voltage MOS transistor. The low voltage and high voltage transistors are implemented for peripheral circuits for the nonvolatile memory array circuits, logic circuits and linear analog circuits. A threshold setting implant is applied to the channel regions of the charge retaining transistors of the NAND and NAND-based NOR memory arrays.

A high voltage thick insulation layer is grown in the area for the logic circuits and linear analog circuits and the peripheral circuits for the nonvolatile memory circuits. In various embodiments the high voltage thick insulation layer is a oxide insulation layer grown on the surface of the substrate. Upon removal of the high voltage thick insulation layer in the area of the charge retaining transistors of the nonvolatile memory circuits, a tunneling insulation layer is formed over the area of the charge retaining transistors of the nonvolatile memory circuits. In various embodiments, the tunneling insulation layer is a tunneling oxide.

In some embodiments, a first conductive layer is formed on the substrate above the tunnel insulation layer and the thick insulation layer. In various embodiments the first conductive layer is a first polycrystalline silicon layer. The first conductive layer is patterned to define a floating gate for each of the floating gate charge retaining transistors. Then, a nitride layer and two oxide layers are formed on the first conductive layer to form an oxide-nitride-oxide (ONO) charge trapping layer.

An active area mask is employed to define the areas of the shallow trench isolation to separate the area of the nonvolatile memory array circuits, the logic circuits and the linear analog circuits. The defined areas of the active area mask are etched to create the trenches and then filled with trench insulation that in various embodiments is a silicon oxide. Further, in various embodiments the shallow trench isolation self-aligns the charge retaining regions of the charge retaining transistors. In the embodiments having floating gate charge retaining regions, the shallow trench isolation provides the self alignment of the first conductive layer to improve performance of the charge retaining transistors.

In the embodiments having a floating gate charge retaining transistors, an inter-level dielectric layer is formed on the first conductive layer. In various embodiments, the inter-level dielectric layer is an oxide-nitride-oxide (ONO) formed by a high temperature chemical vapor deposition. The inter-level dielectric is then etched in the active areas for peripheral circuitry of the nonvolatile memory array circuits, the logic circuits, and the linear circuits and a dual gate mask is formed. The high voltage thick insulation is removed in the active areas for peripheral circuitry of the nonvolatile memory array circuits, the logic circuits, and the linear circuits having the low voltage transistors and a thin gate insulation is grown in the regions defining the low voltage transistors. The thin gate insulation, in various embodiments, is a silicon oxide.

A second conductive layer is formed on the surface of the substrate. In various embodiments, the conductive layer is a second polycrystalline silicon that is deposited to thickness of from approximately 1,500 Å to 3,000 Å. The second polycrystalline silicon conductive layer is doped to with an impurity to increase the conductivity of the second polycrystalline silicon conductive layer. In some embodiments, the second polycrystalline silicon conductive layer has a conductive film added to a top surface to form a low resistance polycide layer. A capping layer is deposited over the second conductive layer to prevent peeling of the conductive films where in various embodiments the conductive films are tungsten.

A control gate mask is applied to the second polycrystalline silicon conductive layer with the capping layer to define the control gates of the charge retaining transistors and the gates of the NMOS and PMOS transistors of the peripheral circuits for the nonvolatile memory array circuits, logic circuits and linear analog circuits. A PMOS mask is formed over the regions of the PMOS transistors to protect the regions of the PMOS transistors. A first lightly doped drain (LDD) implant of an impurity of the first conductivity type is applied to the surface of the substrate. The capping layer, the second polycrystalline layer, the inter-level dielectric, the first polycrystalline silicon layer, and the tunneling insulation layer form a stacked gate for the floating gate charge retaining transistors. The stacked gate becomes a self-aligning feature for the lightly doped drain implant to form the source and drains of the floating gate charge retaining transistors. The capping layer and the gates of the NMOS transistors peripheral circuits for the nonvolatile memory array circuits, logic circuits and linear analog circuits are self-aligning features for the lightly doped drain implant to form the lightly doped drains of the peripheral circuits for the nonvolatile memory array circuits, logic circuits and linear analog circuits. The lightly doped drain implant may be an arsenic implant or a phosphorus implant of a density of from approximately 1e12 to approximately 1e15.

A NMOS mask is placed over the regions of the NMOS transistors of the nonvolatile memory array, the peripheral circuits for the nonvolatile memory array circuits, logic circuits and linear analog circuits. A second lightly doped drain implant of an impurity of the second conductivity type is applied to the surface of the substrate. The capping layer and the gates of the PMOS transistors peripheral circuits for the nonvolatile memory array circuits, logic circuits and linear analog circuits are self-aligning features for the lightly doped drain implant to form the lightly doped drains of the peripheral circuits for the nonvolatile memory array circuits, logic circuits and linear analog circuits. The lightly doped drain implant may be a boron implant or a boron di-flouride (BF2) implant of a density of from approximately 1e12 to approximately 1e15.

A peripheral implant mask is formed over the substrate leaving the nonvolatile memory array circuits exposed for a cell source and drain implant. The stacked gate is self-aligning feature for the cell source/drain implant of the first conductivity type to form the source and drains for the charge retaining transistors. In some embodiments, the cell source/drain implant is preceded by a halo implant of the second conductivity type within the triple well against the junction walls to limit the extent of depletion regions.

A thick insulation layer is formed on the surface of the substrate and then defined to form spacers adjacent to the stacked gate structure of the charge retaining transistors and the gates of the NMOS and PMOS transistors. The low voltage transistors and the nonvolatile memory array circuits have a high voltage diffusion masking applied to them. A double diffusion implant of the first conductivity type is applied to the high voltage transistors to form the source and drain of the high voltage transistors. In various embodiments the implant density is chosen such that the junction breakdown voltage is greater than approximately +20V.

The high voltage diffusion masking is removed and a first low voltage diffusion masking is applied to the regions of the nonvolatile memory array circuits, logic circuits and linear analog circuits having the second type conductivity and a first low voltage diffusion having a conductivity of the first type is applied to the low voltage and high voltage transistors of the first conductivity type to form a shallow junction depth for low voltage applications and for a metal contact for the high voltage transistors. In some embodiments, the high voltage transistors are covered with the first low voltage diffusion masking. Upon removal of the low voltage diffusion masking from the high voltage region, a diffusion plug is created to make a contact region for the source and drains of the high voltage transistors.

The first low voltage diffusion masking is removed from the surface of the substrate and a second low voltage diffusion masking is applied to the high and low voltage transistors of the first conductivity type. A second low voltage diffusion is applied to the area of the transistors with the second conductivity type to create the is source and drains of the transistors of the second conductivity type to form a shallow junction depth for low voltage applications.

A second interlayer dielectric is formed on the surface of the substrate. The second interlayer dielectric is a borophosphosilicate glass (BPSG) or a phosphosilicate glass (PSG). The second interlayer dielectric is formed by chemical vapor deposition followed by a chemical mechanical planarization. A photoresist layer is formed on the second interlayer dielectric and patterned to expose the drain and source regions of the charge retaining transistors and the NMOS and PMOS transistors. An etching process exposes the drain and source regions of the charge retaining transistors and the NMOS and PMOS transistors. Contact regions are made to the sources and drains and filled with a barrier metal. In various embodiments, the barrier metal is Titanium Nitride/titanium alloy.

A first level metal is formed on the surface of the second interlayer dielectric. In some embodiments, the first level metal is sputtered onto the surface of the substrate or electroplated on the surface of the substrate. In various embodiments the first level metal is aluminum and other embodiments, the first level metal is copper. The first level metal is then patterned to form interconnections for the nonvolatile memory array circuits, logic circuits and linear analog circuits. Additional layers of the interlayer dielectric and metal conductors are formed to provide more interconnections for the nonvolatile memory array circuits, logic circuits and linear analog circuits.

BRIEF DESCRIPTION OF THE DRAWINGS

FIG. 1a is a schematic of a NAND-based NOR flash memory cell embodying the principles of the present invention.

FIGS. 1b-1 is a top plan view of an implementation of a NAND-based NOR flash memory cell embodying the principles of the present invention.

FIGS. 1b-2 is a cross sectional view of an implementation of a NAND-based NOR flash memory cell embodying the principles of the present invention.

FIGS. 2-16, 17a-17b, 18-20 are cross-sectional diagrams defining an embodiment of a process for fabricating a System-on-Chip integrated circuit embodying the principles of the present invention incorporating various embodiments of NAND-based NOR cells and NAND cells.

DETAILED DESCRIPTION OF THE INVENTION

Figure 1C:
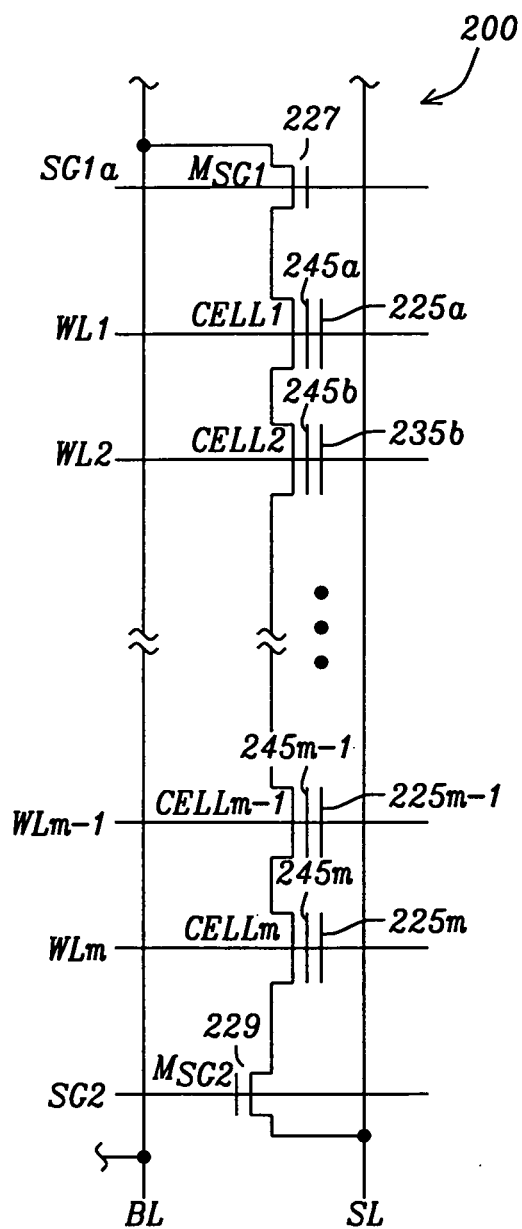
FIG. 1c is a schematic of an embodiment of a NAND cell NAND-based NOR flash memory cell.

The punch-through phenomenon of the charge retaining transistors of the NOR flash memory cell has forced the charge retaining transistors to be fabricated with a sufficiently large channel length to prevent the punch-through. While the NAND flash memory cell is structured to have a serial NAND string with a gating transistor that overcomes the scaling problem, the NAND flash memory cell has a relatively slow read speed. The size of the NOR flash memory cell and the slow read speed of the NAND flash memory cell make them actually unsuitable embedded flash memory technology for System-on-Chip (SoC) designs. The power consumption of the NOR flash memory cells of the prior art does not meet the requirements of "Green Memory". The slow read speed of the NAND cell can not meet the performance requirements for SoC designs.

The 771 patent application describes a NAND-based NOR flash memory cell. The NAND-based NOR memory cell is designed and marketed by APlus Flash Technology, Inc., San Jose, Calif. under the HiNOR™ name. The NAND-based NOR flash memory cell combines the advantage of the scaling capability of NAND flash memory cell and the fast read speed of the NOR flash memory cell to provide a true low power flash memory for the embedded applications for the SoC.

A SoC is formed on a substrate that is divided into functional regions. The functional regions include at least one embedded memory region that includes at least one NAND-based NOR flash memory array. The functional regions further include at least one logic region that includes logic circuits configured to be a computer central processing unit (CPU), a digital signal processor, a graphics processor, or any other logical function. The functional regions further includes at least one linear region that includes analog circuits configured to be a radio transmitter, a radio receiver, an audio amplifier, power supply control circuitry, or any other analog function.

FIG. 1a is the schematic diagram of a NAND-based dual floating gate transistor NOR flash memory cell 100 embodying the principles of the present invention. FIG. 1b-1 is a top plan view of an implementation of a NAND-based NOR flash memory cell 100 embodying the principles of the present invention. FIG. 1b-2 is a cross sectional view of an implementation of a NAND-based NOR flash memory cell 100 embodying the principles of the present invention. The NAND-based NOR flash memory cell 100 is formed in the top surface of a P-type substrate P-SUB. A N-type material is diffused into the surface of the P-type substrate P-SUB to form a deep n-type diffusion well DNW. A P-type material is then diffused into the surface of the deep n-type diffusion well DNW to form a shallow p-type diffusion well TPW (commonly referred to as a triple P-well). The N-type material is then diffused into the surface of the shallow p-type diffusion well TPW to form the source/drain region (D) 115 of the floating gate transistor M0, the source/drain region 122 of the floating gate transistor M1 and the common to source/drain (S/D) 120. The common source/drain 120 is structured to provide the sole connection of the source region of the floating gate transistor. M0 and the drain of the floating gate transistors M1. A first polycrystalline silicon layer is formed above the bulk region of the shallow p-type diffusion well TPW between the source/drain region 115 and the common source/drain region 120 floating gate transistor M0 and the common source/drain region 120 and the source/drain region 122 of the floating gate transistor M1 to form the floating gates 145*a* and 145*b*. A second polycrystalline silicon layer is formed over the floating gates 145*a* and 145*b* to create the control gates (G) 125*a* and 125*b* of the floating gate transistors M0 and M1. The common source/drain region 120 is formed as self-aligned between the two adjacent second polycrystalline silicon layers of two control gates 125*a* and 125*b* of floating gate transistors M0 and M1. The common source/drain 120 is used in the floating gate transistors M0 and M1 to reduce the source line pitch.

The gate length of the floating gate transistors M0 and M1 is the channel region in the bulk regions 132*a* and 132*b* of shallow P-type well TPW between source/drain region 115 and the common source/drain region 120 of the floating gate transistor M0 and the common source/drain region 120 and the source/drain region 122 of the floating gate transistors M0 and M1. The NOR floating gate transistor's 110 channel width is determined by the width of the N-diffusion of the source/drain region 115, the source/drain region 122 and the common source/drain region 120. The typical unit size of the dual floating gate transistor NOR flash memory cell 100 is from approximately $12\lambda^2$ to approximately $15\lambda^2$. Therefore the effective size for a single bit NOR cell is approximately $6\lambda^2$. The effective size ($6\lambda^2$) of a single bit NOR cell is slightly larger than a NAND cell size of the prior art. However, the effective size of a single bit NOR cell is much smaller than the NOR cell size ($15\lambda^2$) of the prior art for a semiconductor manufacturing process below 50 nm. The effective single bit/single transistor size of the dual floating gate transistor NOR flash memory cell 100 remains constant an effective cell size of approximately $6\lambda^2$. The constant cell size is a result of the scalability is identical to that of the NAND flash memory cell of the prior art.

The floating gate layers 145*a* and 145*b* each respectively store electron charges to modify the threshold voltage of the floating gate transistors M0 and M1. In all operations such as read, program and erase, the P-type substrate P-SUB is always connected to a ground reference voltage source (GND). The deep n-type diffusion well DNW is connected to the power supply voltage source (VDD) in read and program operations but is connected to a very large erase voltage level of from approximately +20V to approximately +25.0V in a Fowler-Nordheim channel erase operation. The is shallow P-type well TPW is connected to the ground reference voltage in normal read and program operations but is connected to the very large erase voltage level in the Fowler Nordheim channel erase operation. The deep n-type diffusion well DNW and the shallow p-type diffusion well TPW are biased commonly to the very large erase voltage level to avoid the undesired forward current. In present designs of dual floating gate transistor NOR flash memory cell 100, the power supply voltage source is either 1.8V or 3.0V.

In an array of dual floating gate transistor NOR flash memory cells 100, the floating gate transistors M0 and M1 are arranged in rows and columns. The second polycrystalline silicon layer 125 that is the control gate of the floating gate transistors M0 and M1 and is extended to form a word-line WL that connects to each of the floating gate transistors M0 and M1 on a row of the array. The drain/source 115 of the floating gate transistors M0 and M1 is connected to a bit line BL. The source/drain 122 of the floating gate transistor M1 is connected to a source line SL. The bit line BL and the source line SL being formed in parallel and in parallel with a column of the floating gate transistors M0 and M1

A tunnel oxide is formed on top of the channel region 132*a* and 132*b* between the source/drain region 115 and the common source/drain region 120 of the floating gate transistor M0 and between the common source/drain region 120 and the source/drain region 122 of the floating gate transistor M1 and beneath the floating gates 145*a* and 145*b*. The thickness of the tunnel oxide is typically 100 Å. The tunnel oxide is the layer through which the electron charges pass during the Fowler-Nordheim channel tunneling programming and erasing. During a programming operation, the Fowler-Nordheim tunnel programming attracts electrons to the floating gates 145*a* and 145*b* through the tunnel oxide from cell's channel regions 132*a* and 132*b* within the shallow p-type diffusion well TPW. During an erasing operation, the Fowler-Nordheim tunnel erasing expels stored electrons from the floating gates 145*a* and 145*b* through the tunnel oxide to cell's channel regions 132*a* and 132*b* and thus into the shallow p-type diffusion well TPW.

After an erase operation, fewer electron charges are stored in the floating gates 145*a* and 145*b* that results in a decrease in an erased threshold voltage level (Vt0) of the floating gate transistors M0 and M1. In contrast, in a Fowler-Nordheim program operation, electrons are attracted into floating gates 145*a* and 145*b* so that a first programmed threshold voltage level (Vt1) and a second programmed threshold voltage level of the floating gate transistors M0 and M1 by applying the very large programming voltage level of from approximately 15.0V to approximately 20.0V to the control gates 125*a* and 125*b* of the floating gates 145*a* and 145*b*.

Figure 1D:
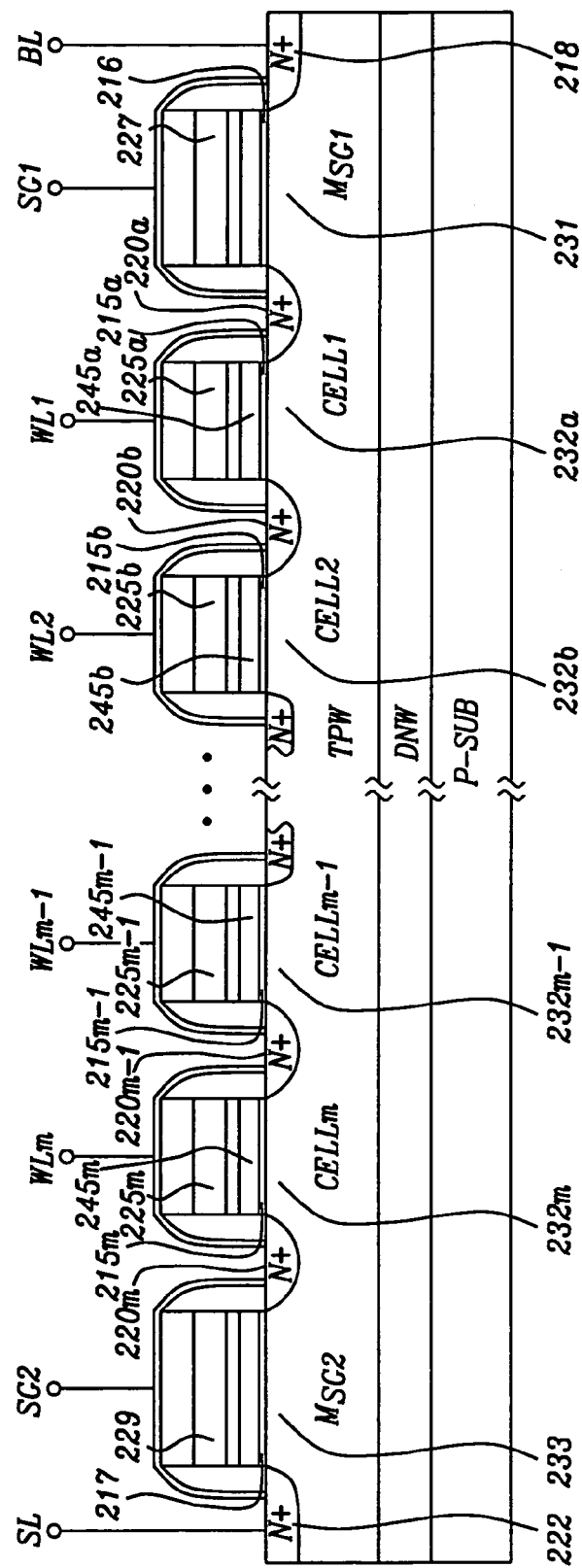
FIG. 1d is a cross-sectional diagram of the embodiment of a NAND cell of FIG. 1c NAND-based NOR flash memory cell.
Figure 2:
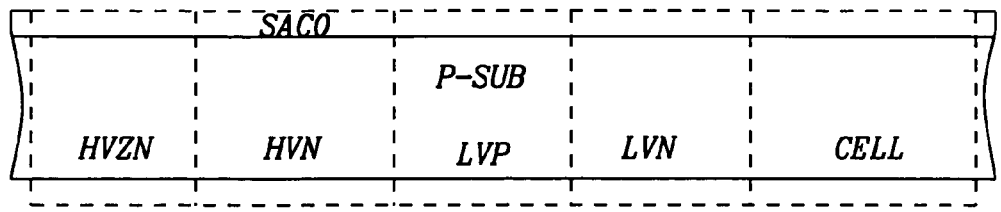

FIG. 1*c* is a schematic of an embodiment of a NAND cell and FIG. 1*d* is a cross-sectional diagram of the embodiment of a NAND cell of FIG. 1*c*. The NAND flash memory cell 5 is fashioned from a serially connected group of charge retaining floating gate transistors cell1, cell2, . . . , cellm-1, cellm, a top select transistor $M_{SG1}$, and bottom select transistors $M_{SG2}$ are formed within a substrate P-SUB. A deep N-well DNW is formed in the substrate and a triple P-well TPW is formed in the deep N-well DNW. Common drain/source regions 220*a*, 220*b*, . . . , 220*m*, the drain 218 of the top select transistor $M_{SG1}$, and the source 222 of the bottom select transistors $M_{SG2}$ are formed within the triple P-well TPW. A relatively thin gate oxide 216 and 218 and a tunneling oxide 215*a*, 215*b*, . . . , 215*m* are deposited on the substrate P-SUB over the triple P-well TPW in the channel regions 232*a*, 232*b*, . . . , 232*m* of the charge retaining floating gate transistors cell1, cell2, . . . , cellm-1, cellm, the channel region 231 of the top select transistor $M_{SG1}$, and the channel region 233 of the bottom select transistors $M_{SG2}$. A polycrystalline silicon layer that forms the charge retaining floating gates 245*a*, 245*b*, . . . , 245*m* is then disposed over the tunneling oxide 215*a*, 215*b*, . . . , 215*m* above the channel regions 232*a*, 232*b*, . . . , 232*m* between drain/source regions 220*a*, 220*b*, . . . , 220*m*. A second dielectric oxide layer is placed on top of charge retaining floating gates 245*a*, 245*b*, . . . , 245*m* to separate the charge retaining floating gates 245*a*, 245*b*, . . . , 245*m* from a second poly-crystalline silicon layer that forms the control gates 225*a*, 225*b*, . . . , 225*m* of the charge retaining floating gate transistors cell1 cell2, cellm-1, . . . , cellm. The second poly-crystalline silicon layer also forms the gate 227 of the top select transistor $M_{SG1}$ and the gate 229 of the bottom select transistors $M_{SG2}$. The control gates 225*a*, 225*b*, . . . , 225*m* of the charge retaining floating gate transistors cell1, cell2, ..., cellm-1, cellm are connected to word lines WLa, WLb, ..., WLm. The drain region 218 of the top select transistor $M_{SG1}$ is connected to a bit line BL and the source 222 of the bottom select transistors $M_{SG2}$ is connected to a source line SL. The gate 227 of the top select transistor $M_{SG1}$ is connected to a first select gate control signal SG1 and the gate 229 of the bottom select transistors $M_{SG2}$ is connected to a second select gate control signal SG2. The control signal WL1 to WLm are connected the charge retaining floating gate transistors cell1, cell2, ... cellm-1, cellm during reading, programming, and erasing.

The bit line BL and the source line SL are connected to a column controller (not shown) to provide the necessary bit line operational voltages to selected NAND flash memory cells 200 for programming, reading, and erasing retained charges representing digital data bits within charge retaining floating gates 245a, 245b, ..., 245m of each of the selected NAND flash memory cells 200.

The word lines WL1, WL2, ..., WLm, top select gate line SG1, and the bottom select gate line SG2 are connected to a word line controller (not shown). The word line controller transfers word line operational voltages for selecting, programming, reading, and erasing the retained charges representing the digital data bits within the charge retaining floating gates 245a, 245b, ..., 245m of each of the selected NAND flash memory cells 200.

Figure 3:
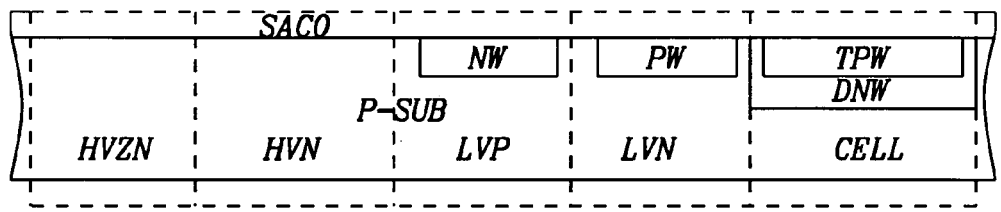

FIGS. 2 to 16, 17a-17b, 18-20 are cross-sectional diagrams defining an embodiment of a process for fabricating a System-on-Chip integrated circuit embodying the principles of the present invention incorporating NAND cells and NAND-based NOR cells. In FIG. 2 a sacrificial oxide SACO is grown on the surface of a provided P-type substrate P-SUB to a thickness of approximately 200 Å. FIG. 3 illustrates four implantation steps. In the first step an impurity species of a first conductivity type that in various embodiments is an N-type impurity is implanted in the surface of the P-type substrate P-SUB to form a deep N-type well region DNW in the nonvolatile memory cell region NVMC. In the second step, an impurity species of the second conductivity type that in various embodiments is P-type impurity is implanted in the deep N-type well DNW to form a triple P-type well region TPW in the nonvolatile memory cell region NVMC. In various embodiments, the triple P-type well region TPW is formed by implanting ions such as boron ions with an implantation of energy of about 50,000 volts. In the third step, the impurity species of the first type (N+) is implanted into the region LVP of the P-type substrate P-SUB that will contain low voltage PMOS transistors to form a normal N-type well NW. In the fourth step, the impurity species of the second type (P+) is implanted into the region LVN of the P-type substrate P-SUB that will contain low voltage NMOS transistors to form a normal P-type well PW. A drive-in process is performed for all the dopants in the p-type well PW and the n-type well NW. Each of the p-type wells PW and the n-type wells NW are driven to different required depths based on their application.

Figure 4:
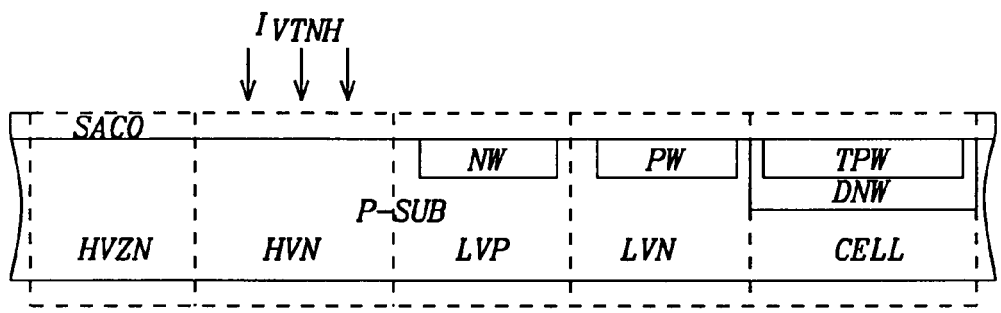
Figure 5:
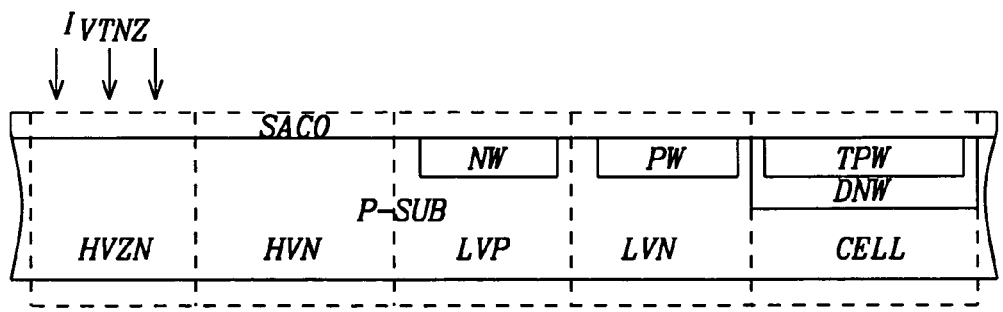
Figure 6:
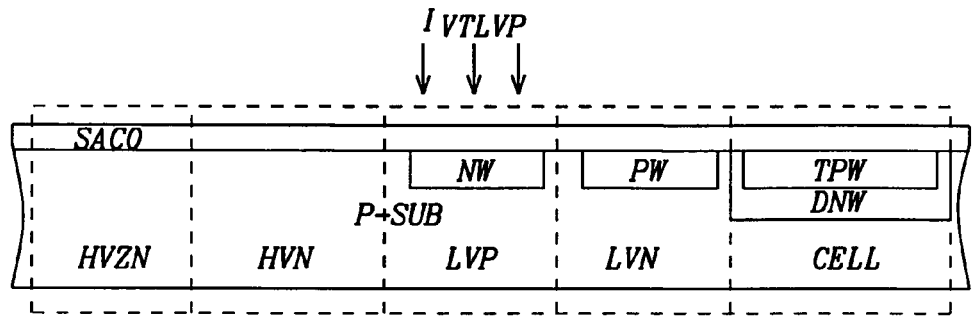
Figure 7:
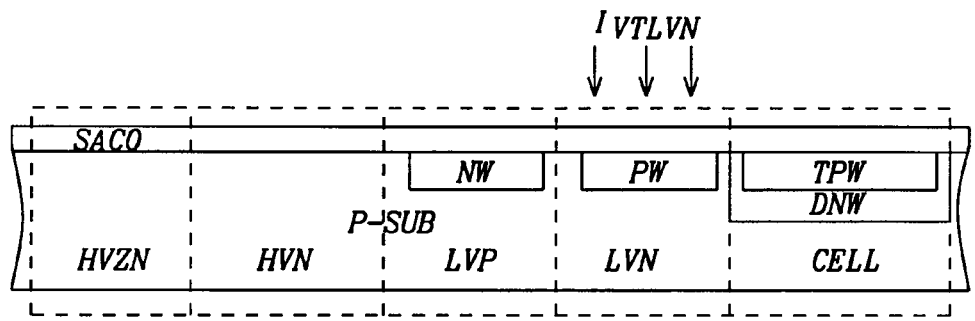
Figure 8:
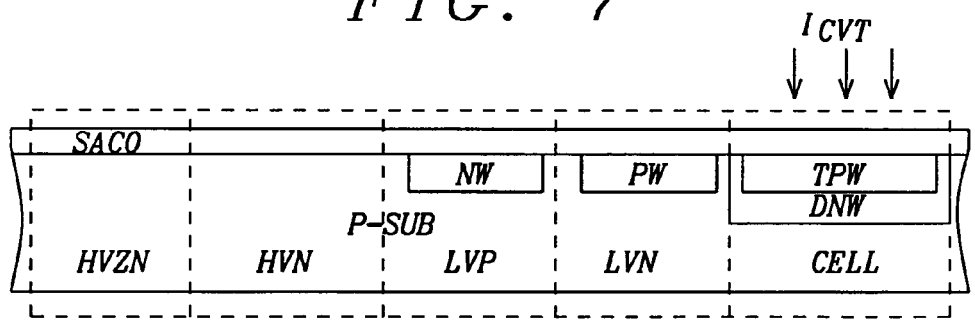

In FIG. 4, a threshold adjustment impurity species $I_{VTNH}$ is implanted in the surface of the P-type substrate P-SUB in the region HVN that is occupied by the high voltage NMOS transistors. The implant energy needs to be adjusted so that it will implant through the sacrificial oxide SACO. In FIG. 5, a threshold adjustment impurity species $I_{VTNZ}$ is implanted in the surface of the P-type substrate P-SUB in the region HVZN that is occupied by the high voltage zero threshold NMOS transistors. The implant energy needs to be adjusted so that it will implant through the sacrificial oxide SACO. In FIG. 6, a threshold adjustment impurity species $I_{VTLVP}$ is implanted in the surface of the P-type substrate P-SUB in the N-well region NW that is occupied by the low voltage PMOS transistors. As previously described, the implant energy needs to be adjusted so that it will implant through the sacrificial oxide SACO. In FIG. 7, a threshold adjustment impurity species $I_{VTLVN}$ is implanted in the surface of the P-type substrate P-SUB in the P-well region PW that is occupied by the low voltage NMOS transistors. As previously described, the implant energy needs to be adjusted so that it will implant through the sacrificial oxide SACO. In FIG. 8, a threshold adjustment impurity species $I_{CVT}$ is implanted in the surface of the P-type substrate P-SUB in the nonvolatile memory cell region NVM that is occupied by the charge retaining floating gate transistors. As previously described, the implant energy needs to be adjusted so that it will implant through the sacrificial oxide SACO.

Figure 9:
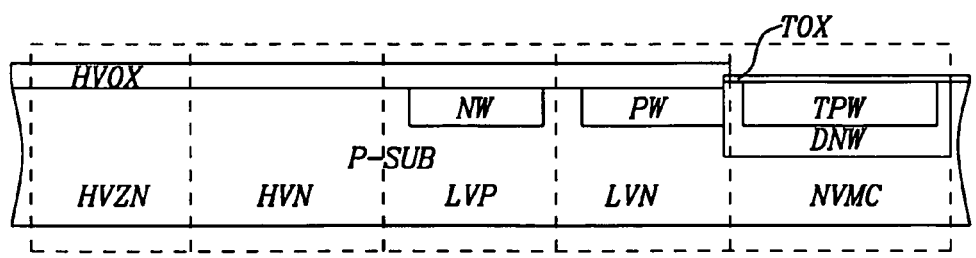
Figure 10:
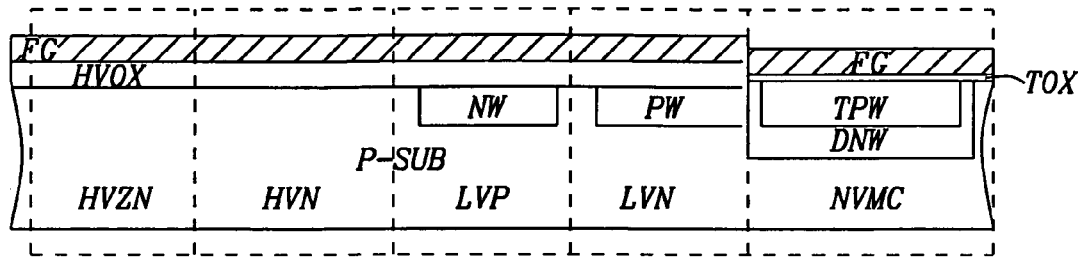

In FIG. 9, the surface of the P-type substrate P-SUB is exposed to a nitride for growing a thick high voltage oxide HVOX to cover the high voltage transistor regions HVZN and HVN and the low voltage transistor regions LVP and LVN. A nitride removal operation and a pad oxide stripping operation are then performed in the nonvolatile memory cell region NVMC. A tunnel oxide TOX is then grown in the nonvolatile memory cell region NVMC. A first conductive layer FG of polycrystalline silicon is deposited across the whole P-type substrate P-SUB as shown in FIG. 10. This conductive layer FG is a doped polycrystalline silicon that is formed by chemical vapor deposition to form an undoped polycrystalline silicon layer followed by performing an ion implantation process to dope the undoped polycrystalline silicon layer to the appropriate conductivity. The first conductive layer is approximately 800~1200 Angstroms thick.

Figure 11:
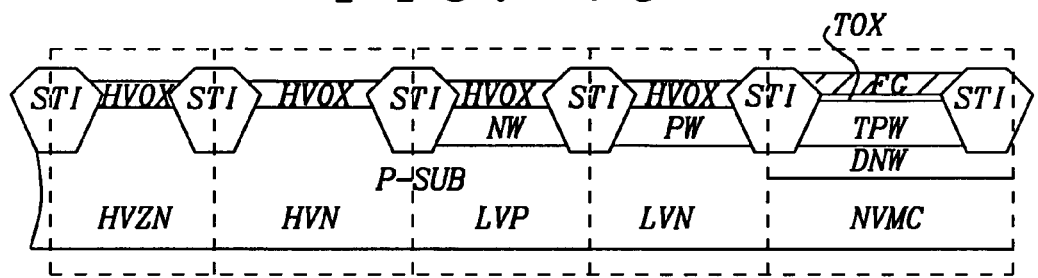

Referring now to FIG. 11, an active area mask is applied to the first doped polycrystalline silicon conductive layer FG to define the trench area. An etching process is performed to create the trenches that define the nonvolatile memory cell region NVMC, the low voltage PMOS transistor region LVP, the low voltage NMOS transistor region LVN, the high voltage zero threshold NMOS transistor region HVZN, and the high voltage NMOS transistor region HVN. The doped polycrystalline silicon layer FG in exposed areas of the active area mask is etched with such that it is self-aligned with the active area to form the charge retaining floating gate. This greatly improves the performance of the flash cell array. It is very critical to treat corners of the tunnel oxide layer TOX so that the leakage at the flash cell edge is controlled to a low level.

Figure 12:
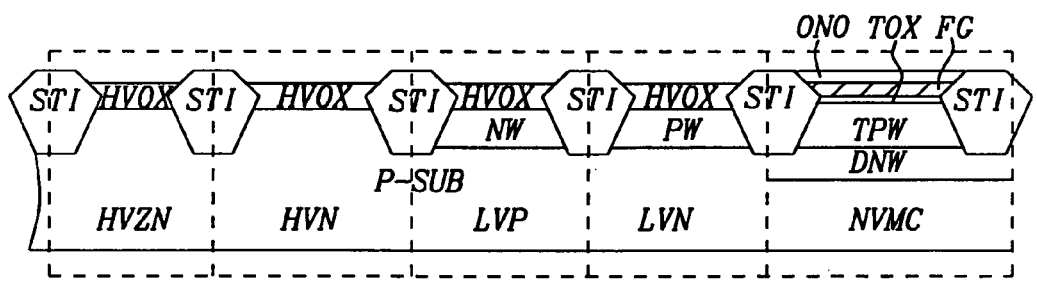

Refer now to FIG. 12. In the active area of the nonvolatile memory region NVMC, a device dielectric layer ONO is formed on the surface of the doped polycrystalline silicon layer FG that is the floating gate for each of the floating gate charge retaining transistors. The device dielectric layer ONO is created by high temperature chemical vapor deposition of a layer of silicon oxide, followed by a layer of to silicon nitride, and followed by another layer of silicon oxide on the floating gate doped polycrystalline silicon layer FG. In the process, the chemical vapor deposition is over the entire P-type substrate P-SUB and is etched away from the high voltage transistor regions HVZN and HVN and the low voltage transistor regions LVP and LVN external to the nonvolatile memory region NVMC.

Figure 13:
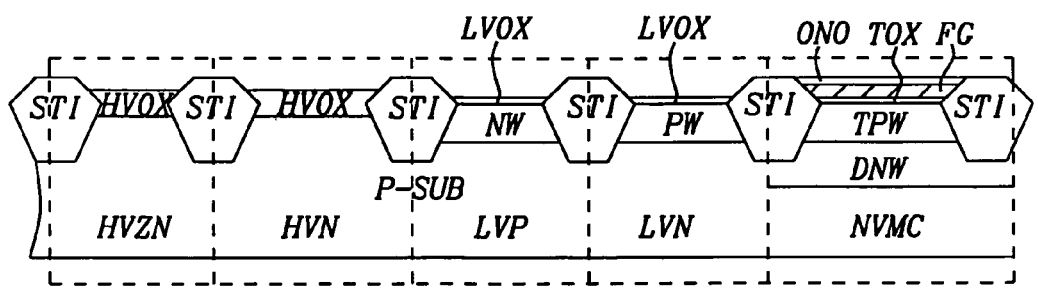

In FIG. 13, a dual gate mask is placed on the P-type substrate P-SUB with the low voltage transistor regions LVP and LVN exposed. The high voltage oxide HVOX is etched away in the exposed low voltage transistor regions LVP and LVN. A thin oxide LVOX is then grown in the low voltage transistor regions LVP and LVN.

Figure 14:
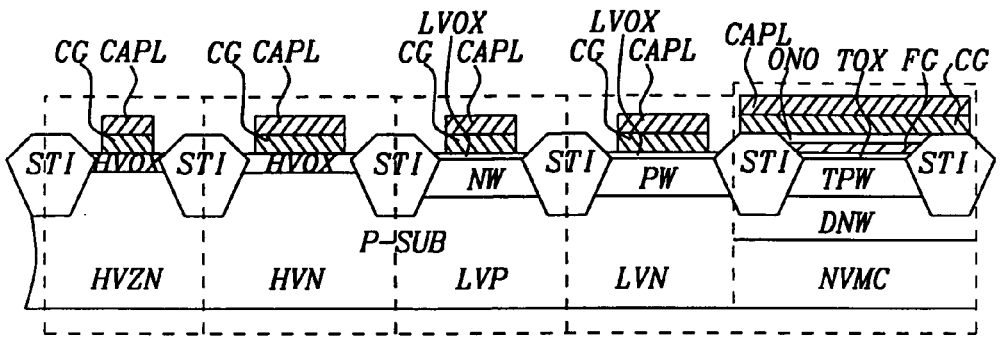

In FIG. 14, a second doped polycrystalline silicon conductive layer CG is deposited on the entire surface of the P-type substrate P-SUB to a thickness from approximately 500 Å to approximately 1,000 Å. The second doped polycrystalline silicon conductive layer CG is formed by a chemical vapor deposition doped in situ. In some embodiments, the second polycrystalline silicon conductive layer CG has a conductive film added to a top surface to form a low resistance polycide layer. In some embodiments a silicide over polycrystalline silicon (polycide) process is performed with a silicide capping layer CAPL formed on the top surface of the second doped polycrystalline silicon conductive layer CG to prevent the peeling of the tungsten films. The capping layer CAPL is formed of silicon nitride or silicon oxide and has a thickness of from approximately 1,500 Å to approximately 3,000 Å. The capping layer CAPL is also formed with a chemical deposition process.

A mask is placed on the surface of the P-type substrate P-SUB to define the control gates of the floating gate charge retaining transistors of the nonvolatile memory region NVMC and the gate structures of the high voltage transistor regions HVZN and HVN and the low voltage transistor regions LVP and LVN. The second doped polycrystalline silicon conductive layer CG and the capping layer CAPL are etched to remove the material essentially exposing the shallow trench isolation and portions of the thick high voltage oxide HVOX of the high voltage transistor regions HVZN and HVN, the thin oxide LVOX of the low voltage transistor regions LVP and LVN, and the tunnel oxide TOX. This defines the control gates of the nonvolatile memory cell region NVMC and the gates of the high voltage transistor regions HVZN and HVN and the low voltage transistor regions LVP and LVN. The nonvolatile memory cell region NVMC now has the stacked gate structure for each of the floating gate charge retaining transistors of each memory cell. The stacked gate structure consists of the tunnel oxide TOX, the doped polycrystalline silicon conductive floating gate layer FG, the device dielectric layer ONO, the second doped polycrystalline silicon conductive control gate layer CG.

Figure 15:
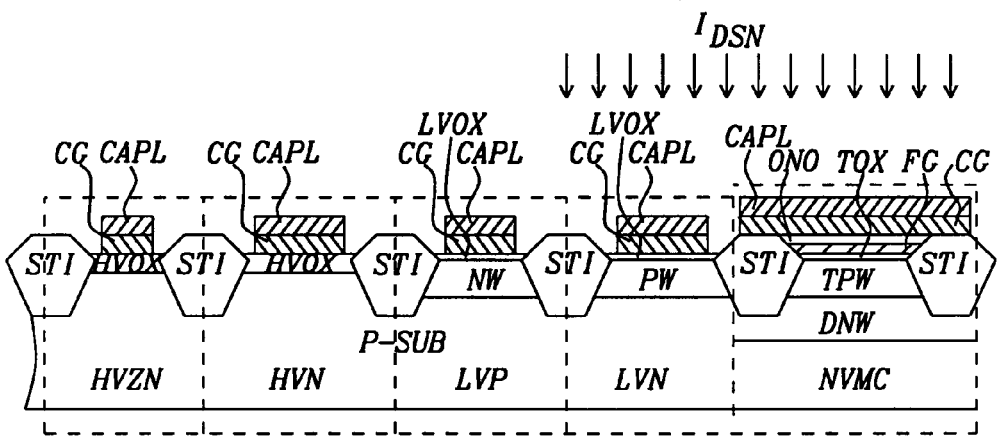

In FIG. 15, the stacked gate structure acts as a self-aligned structure for an N-type lightly doped drain impurity species implant $I_{DSN}$ that is diffused in the nonvolatile memory cell region NVMC and the low voltage transistor region LVN. The N-type lightly doped drain impurity species implant $I_{DSN}$ forms the drains and sources for the N-type MOS transistors and the floating gate charge retaining transistors. The N-type lightly doped drain impurity species implant $I_{DSN}$ is, in some embodiments, an arsenic ion implant and in other embodiments, the N-type lightly doped drain impurity species implant $I_{DSN}$ is a phosphorus ion implant.

Figure 16:
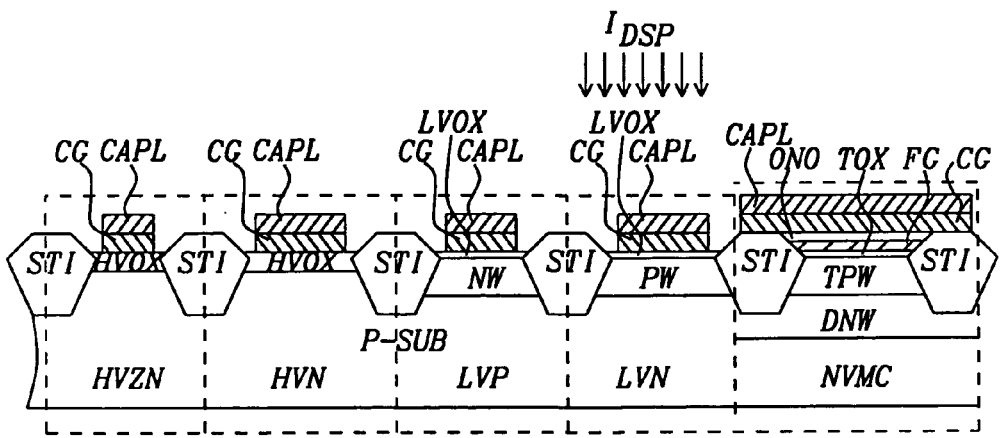

In FIG. 16, the stacked gate structure, again, acts as a self-aligned structure for a P-type lightly doped drain impurity species implant $I_{DSP}$ that is diffused in the low voltage transistor region LVP. The P-type lightly doped drain impurity species implant $i_{DSP}$ forms the drains and sources for the P-type MOS transistors. The P-type lightly doped drain impurity species implant $i_{DSP}$ is, in some embodiments, a Boron ion implant and in other embodiments, the P-type lightly doped drain impurity species implant $I_{DSP}$ is a boron diflouride (BF2) ion implant.

Figure 17A:
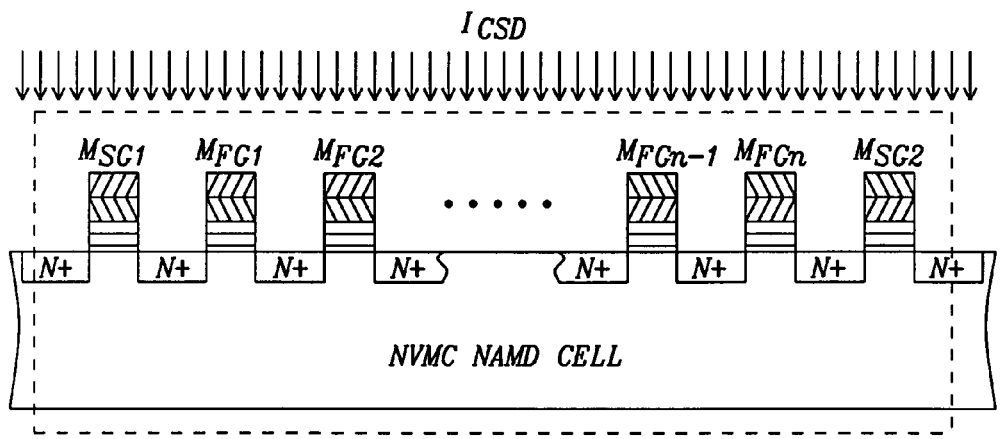

FIG. 17a is a cross-sectional drawing illustrating the structure of a column of a NAND nonvolatile memory cell in the nonvolatile memory cell region NVMC in parallel with the bit and source lines embodying the principles of this invention. The N-type impurity species implant $I_{CSD}$ forms the drains and sources for the floating gate charge retaining transistors. The N-type impurity species $I_{CSD}$ is, in some embodiments, an arsenic ion implant and in other embodiments, the N-type impurity species $I_{CSD}$ is a phosphorus ion implant and is equivalent to the N-type lightly doped drain implant $I_{DSN}$ of FIG. 15, but with a different dosage.

Figure 17B:
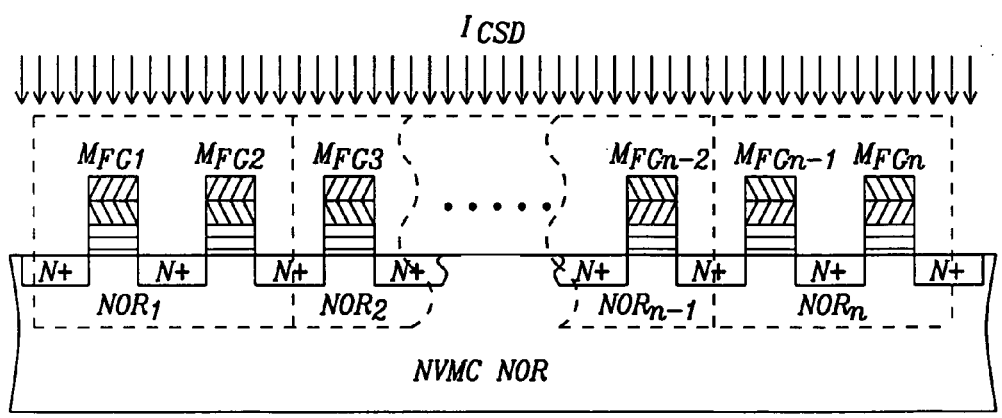

FIG. 17b is a cross-sectional drawing illustrating the structure of a column of NOR nonvolatile memory cells NOR1, NOR2, . . . NORn, in the nonvolatile memory cell region NVMC in parallel with the bit and source lines embodying the principles of this invention. The embodiments of the NOR nonvolatile memory cells NOR1, NOR2, . . . NORn illustrate two NAND-based floating gate charge retaining transistors in each of the NOR nonvolatile memory cells NOR1, NOR2, . . . NORn where one of the NAND-based floating gate charge retaining transistors functions as select gating transistor in operation. The N-type impurity species implant $I_{CSD}$ forms the drains and sources for the floating gate charge retaining transistors of each of the NOR nonvolatile memory cells NOR1, NOR2, . . . NORn. The N-type impurity species implant $I_{CSD}$ is, in some embodiments, an arsenic ion implant and in other embodiments, the N-type impurity species $I_{CSD}$ is a phosphorus ion implant and is similar to the N-type lightly doped drain implant $I_{DSN}$ of FIG. 15.

Figure 18:
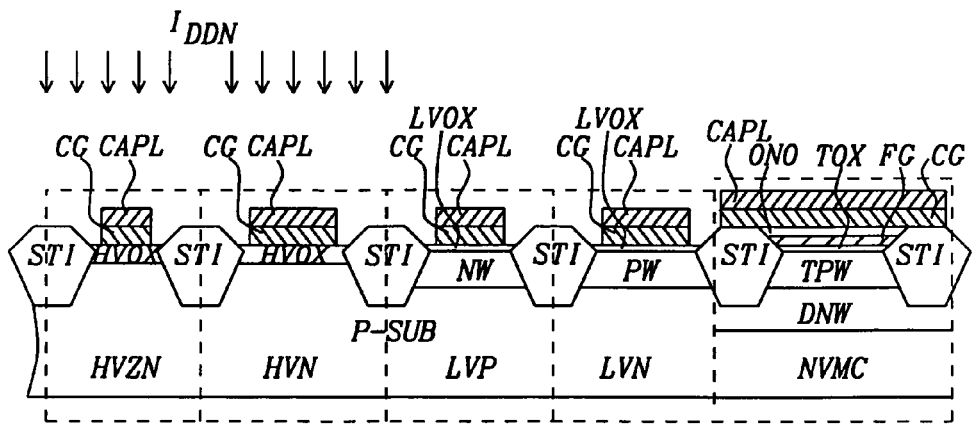

In FIG. 18, the low voltage transistor regions LVP and LVN and the nonvolatile memory cell region NVMC have a mask applied to them and the source and drain regions of the high voltage transistor regions HVZN and HVN are exposed. A double diffused implant IDDn is performed for high voltage NMOS transistors in the high voltage transistor regions HVZN and HVN on top of the P-type substrate P-SUB to form source and drain regions. The density of the impurity species $I_{DDN}$ is selected such that the junction breakdown voltage exceeds approximately +20 volts.

Figure 19:
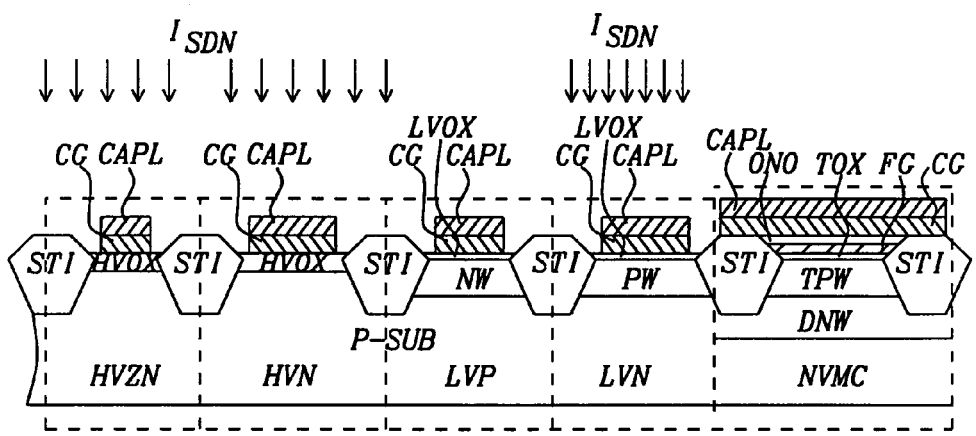

In FIG. 19, the low voltage transistorregion LVP and the nonvolatile memory cell region NVMC have a mask applied to them and the source and drain regions of the high voltage transistor regions HVZN and HVN and the low voltage transistor region LVN are exposed. A normal source/drain implant $I_{SDN}$ is performed in the P-type well PW within the low voltage transistor region LVN to form the source and drain regions of the low voltage transistors in the low voltage transistor regions LVN. The source/drain implant $I_{SDN}$ has a relatively low energy of approximately 10 kV to achieve a shallow junction depth for low voltage applications. The source/drain implant $I_{SDN}$ is also performed in the high voltage transistor regions HVZN and HVN to create the metal contacts for the sources and drains of the high voltage transistors of the high voltage transistor regions HVZN and HVN. In other embodiments, the source/drain implant $I_{SDN}$ in the high voltage transistor regions HVZN and HVN is replaced by a contact plug implant to the N+ contact only to reduce the transistor size.

Figure 20:
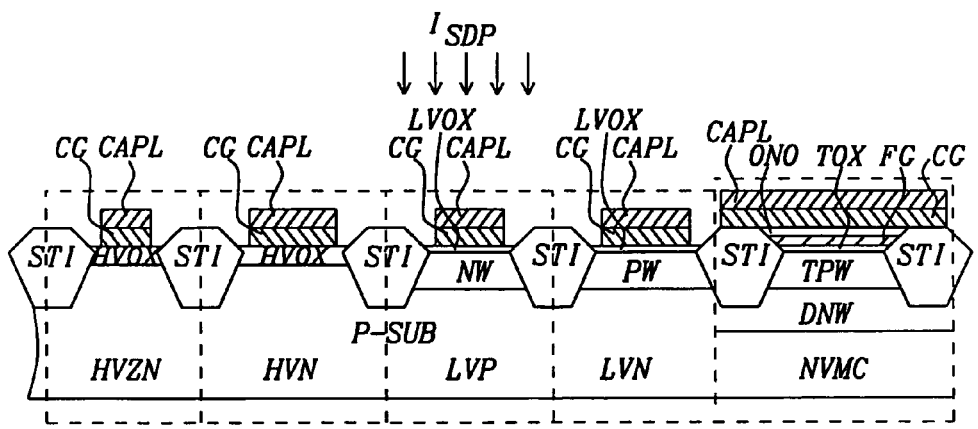

In FIG. 20, the low voltage transistor region LVN and the nonvolatile memory cell region NVMC, and the high voltage transistor regions HVZN and HVN have a mask applied to them and the source and drain regions of the low voltage transistor regions LVP are exposed. A normal source/drain implant $I_{SDP}$ is diffused to the surface of the P-type substrate P-SUB to create the sources and drains for the low voltage PMOS transistors of the low voltage transistor regions LVP. The low voltage source/drain implant $I_{SDP}$ is performed on top of the N-type well NW to form sources and drains of the P-type MOS transistors of the low voltage transistor regions LVP.

Figure 21A:
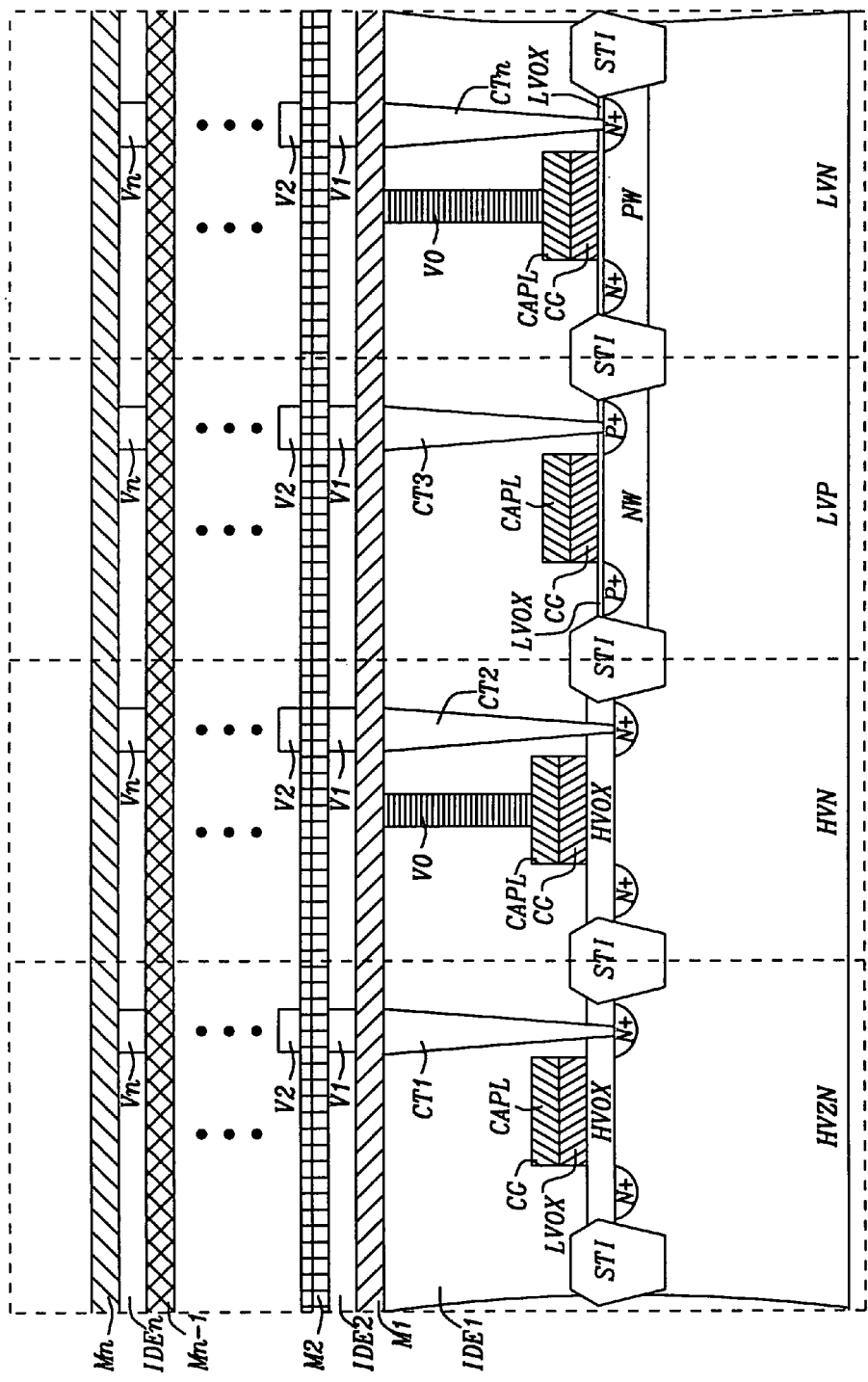
FIGS. 21a-21c are cross-sectional diagrams describing an embodiment of the formation of the contact metallurgy, interlevel dielectric insulating layers, multiple level metal interconnections, and inter-metal via interconnections of the System-on-Chip integrated circuit embodying the principles of the present invention incorporating various embodiments of NAND-based NOR cells and NAND cells.
Figure 21B:
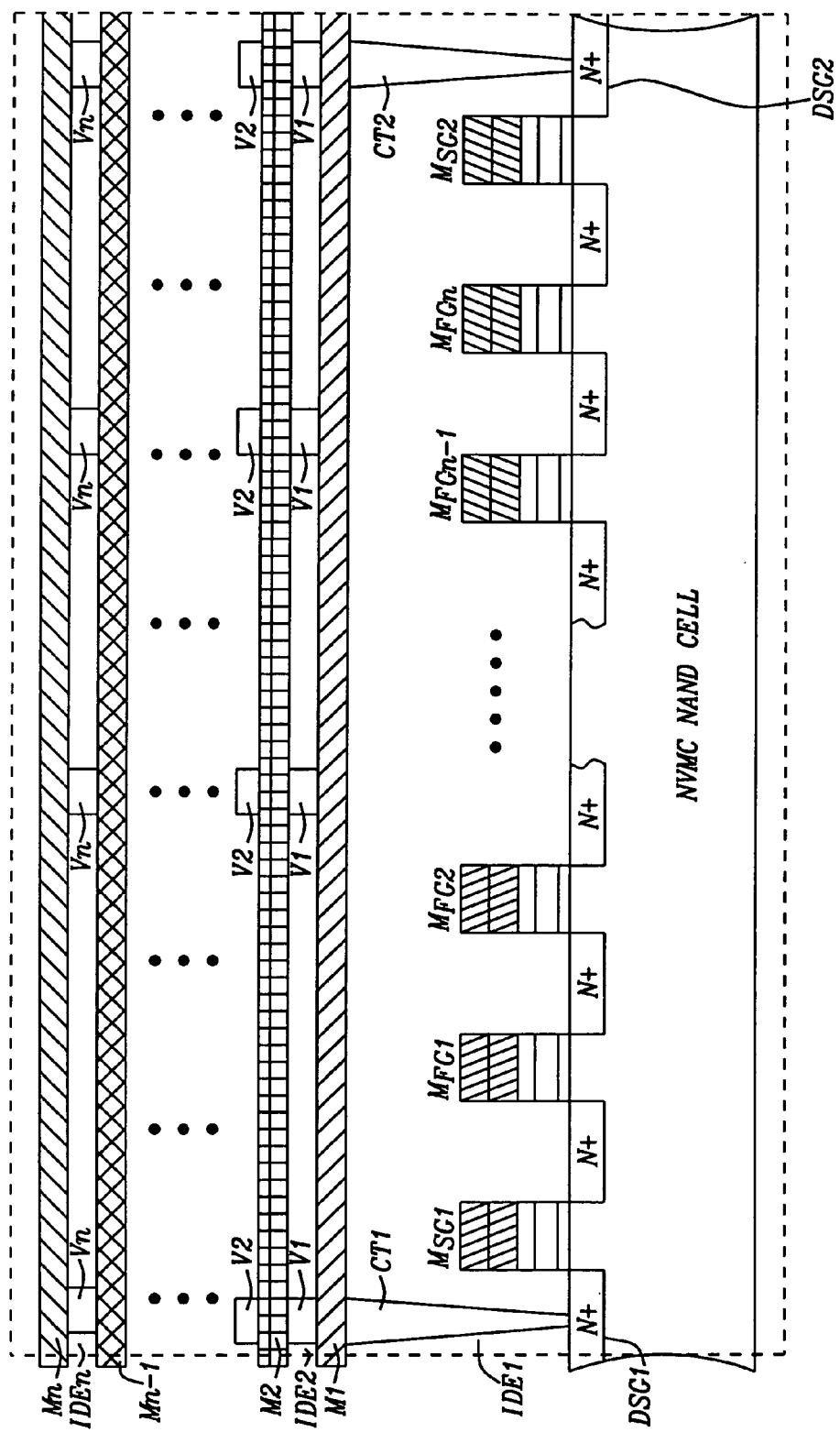
Figure 21C:
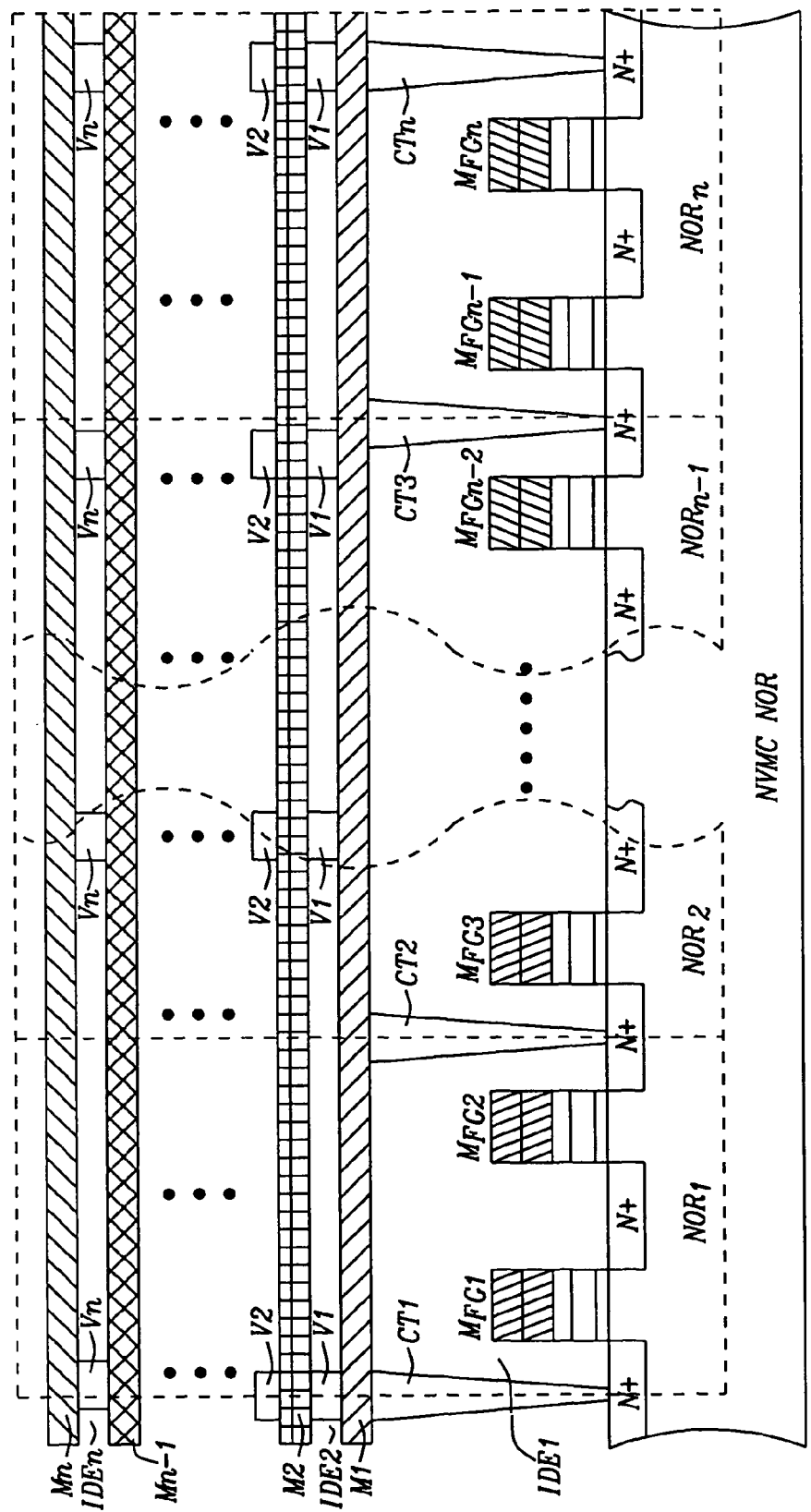

FIGS. 21a-21c are cross-sectional describing an embodiment of the formation of the contact metallurgy, inter-level dielectric insulating layers, multiple level metal interconnections, and inter-metal via interconnections of the System-on-Chip integrated circuit embodying the principles of the present invention incorporating various embodiments of NAND-based NOR cells and NAND cells. FIG. 21a illustrates the low voltage transistor regions LVP and LVN and the high voltage transistor regions HVZN and HVN. FIG. 21c illustrates the structure of a column of NOR nonvolatile memory cells NOR1, NOR2, . . . NORn, in the nonvolatile memory cell region NVMC in parallel with the bit and source lines embodying the principles of this invention. FIG. 21b illustrates the structure of a column of a NAND nonvolatile memory cell in the nonvolatile memory cell region NVMC in parallel with the bit and source lines embodying the principles of this invention. After the implantations as described above, a first interlayer dielectric insulating layer IDE1 is formed on the entire wafer. The first interlayer dielectric insulating layer IDE1 fills the openings formed in the second doped polycrystalline silicon conductive layer CG. The interlayer dielectric insulating layer IDE1 is formed by a chemical vapor deposition process. In some embodiments the first interlayer dielectric insulating layer IDE1 is a borophosphosilicate glass (BPSG) and in other embodiments, the interlayer dielectric insulating layer IDE1 is a phosphosilicate glass (PSG). A chemical mechanical polishing is then conducted to planarize the surface of the first interlayer dielectric insulating layer IDE1.

The surface of the P-type substrate P-SUB is coated with patterned photoresist layer. The patterned photoresist layer is arranged to expose the drain and source regions of the N-type and P-type MOS transistors and floating gate charge retaining transistors of the high voltage transistor regions HVZN and HVN, low voltage transistor regions LVP and LVN, and the nonvolatile memory cell region NVMC. The P-type substrate P-SUB is etched until drain and source regions of the N-type and P-type MOS transistors and floating gate charge retaining transistors of the high voltage transistor regions HVZN and HVN, low voltage transistor regions LVP and LVN, and the nonvolatile memory cell region NVMC are exposed. The patterned photoresist layer and the stacked gate structure with the spacer act as a mask for the etching.

The openings to the selected sources and drains of the N-type and P-type MOS transistors and floating gate charge retaining transistors of the high voltage transistor regions HVZN and HVN, low voltage transistor regions LVP and LVN, and the nonvolatile memory cell region NVMC are filled with a contact barrier metal CT1, CT2, . . . , CTn. The contact barrier metal CT1, CT2, . . . , CTn is a titanium nitride/titanium (TiN/Ti) alloy barrier metal. Where a metal wiring layer must contact a gate of the high voltage transistor regions HVZN and HVN and low voltage transistor regions LVP and LVN and the nonvolatile memory cell region NVMC a similar inter-layer connecting metal V0 is formed in openings formed during the etching.

After the formation of the contact barrier metal CT1, CT2, . . . , CTn and the inter-layer connecting via V0, a first metal conductive layer M1 is formed on the surface of the P-type substrate P-SUB. In some embodiments, the first conductive metal layer M0 is aluminum and is sputtered over the entire surface of the P-type substrate P-SUB. In other embodiments, the first conductive metal layer M1 is copper and is plated in to selective areas on the surface of the P-type substrate P-SUB. In still other embodiments, the first conductive metal layer M1 is copper that is deposited in a single damascene and chemical mechanical polishing CMP process.

For additional conductive metal layers M2, . . . , Mn-1, Mn, an interlayer layer dielectric insulating layer IDE2, . . . , IDEn is deposited on each of the previous conductive metal layers M1, M2, . . . , Mn-1 and patterned with opening to accept the inter-layer connecting vias V1, V2, . . . , Vn. The additional conductive metal layers M2, . . . , Mn-1, Mn are formed on their respective lower interlayer dielectric insulating layer IDE2, . . . , IDEn. In some embodiments, the additional conductive metal layers M2, . . . , Mn-1, Mn are aluminum and are sputtered over the entire surface of the P-type substrate P-SUB. In other embodiments, the additional conductive metal layers M2, . . . , Mn-1, Mn are copper and is plated in selective areas on the surface of the P-type substrate P-SUB. In still other embodiments, the additional conductive metal layers M2, . . . , Mn-1, Mn are copper that is deposited in a single damascene and chemical mechanical polishing CMP process.

In FIG. 21b, the contact barrier metal CT1 is applied to the drain of the first select gate transistor SG1 and the contact barrier metal CT2 the source of the second select gate transistor SG2. The contact barrier metal CT1 is connected to the metal interconnection that forms the bit line for the column of the array of nonvolatile memory cells. The contact barrier metal or other conductive material CT2 is specially formed and connected to the metal interconnection that forms the source line for the column of the array of nonvolatile memory cells.

Similarly, as shown in FIG. 21c, each pair of the floating gate charge retaining transistors of each of the NOR nonvolatile memory cells NOR1, NOR2, . . . NORn has the drain of a first of the floating gate charge retaining transistors in contact with the contact barrier metal CT1, CT2, . . . , CTn and the source of the second of the floating gate charge transistor in contact with the contact barrier metal CT1, CT2, . . . , CTn. For example in the NOR nonvolatile memory cell NOR1 the drain of the first floating gate charge retaining transistor is connected to the contact barrier metal CT1 and the source of the second floating gate charge retaining transistor is connected to the contact barrier metal CT2. The contact barrier metal CT1, CT2, . . . , CTn structures are appropriately connected to the conductive metal layers M1 or M2 that are the bit lines and source lines for the column of NOR nonvolatile memory cells NOR1, NOR2, . . . NORn. The drain of the first floating gate transistors are connected to the bit line and the sources of second floating gate transistors are connected to the source line associated with the column of NOR nonvolatile memory cells NOR1, NOR2, . . . NORn.

The NAND-based NOR structure is such that at least one of the floating gate charge retaining transistors of the column of NOR nonvolatile memory cells NOR1, NOR2, . . . NORn functions as a select gate transistor to prevent leakage current through the plurality of floating gate charge retaining transistors when the floating gate charge retaining transistors is not selected for reading.

While this invention has been particularly shown and described with reference to the preferred embodiments thereof, it will be understood by those skilled in the art that various changes in form and details may be made without departing from the spirit and scope of the invention. The charge retaining transistors in other embodiment have charge trapping oxide/nitride/oxide layers with no floating gate and still embody the principles of the present invention.

The invention claimed is:

1. An integrated circuit formed on a substrate comprising nonvolatile memory array circuits, logic circuits and linear analog circuits,
wherein the nonvolatile memory array circuits, the logic circuits and the linear analog circuits are each formed in active semiconductor areas separated by isolation regions formed of a shallow trench isolation;

wherein the nonvolatile memory array circuits, the logic circuits and the linear analog circuits are in intercommunication to transfer signals and data between them and external circuitry;

wherein the nonvolatile memory array circuits are formed in a triple well structure where a first deep well is formed with an impurity of a first conductivity type and a second well is formed with an impurity of a second conductivity type; and wherein the nonvolatile memory array circuits further comprises NAND-based NOR memory cells having at least two floating gate transistors serially connected such that at least one of the floating gate transistors functions as a select gate transistor to prevent leakage current through the charge retaining transistors when the charge retaining transistors is not selected for reading.

2. The integrated circuit of claim 1 wherein the impurity of the first conductivity type is an N-type impurity.

3. The integrated circuit of claim 1 wherein the impurity of the second conductivity type is a P-type impurity.

4. The integrated circuit of claim 1 wherein nonvolatile memory array circuits further comprises NAND and/or NOR charge retaining cells constructed of rows and columns of formed within designated active areas.

5. The integrated circuit of claim 1 wherein NAND-based NOR charge retaining cells are formed a column with a bit line and a source line associated with each column of the NAND-based NOR charge retaining cells.

6. The integrated circuit of claim 5 wherein a drain of a topmost charge retaining transistor of each of the NAND-based NOR charge retaining cells is connected to the bit line associated with and parallel to each of the columns of serially connected NAND-based NOR charge retaining cells and a source of the bottommost charge retaining transistor of each of the NAND-based NOR charge retaining cells is connected to a source line associated with and parallel to the column of NAND-based NOR charge retaining cells and parallel to the associated bit line.

7. The integrated circuit of claim 4 wherein a control gate of each of the rows of NAND-based NOR flash memory cells is connected to a word line.

8. The integrated circuit of claim 1 wherein the active areas for peripheral circuitry of the nonvolatile memory array circuits, the logic circuits, and the linear circuits comprise a shallow well of the first conductivity type and a shallow well of the second conductivity type into which the low voltage logic and linear circuits are fabricated.

9. The integrated circuit of claim 8 wherein the shallow well of the first conductivity type is an N-well and the shallow well of the second conductivity type is a P-well.

10. The integrated circuit of claim 9 wherein PMOS transistors are formed in the N-well and NMOS transistors are formed in the P-well.

11. The integrated circuit of claim 1 further comprising high voltage MOS transistors formed in the substrate for the logic and linear analog circuits.

12. The integrated circuit of claim 11 wherein ion implantation is performed at the channel regions of the high voltage MOS transistors to establish the appropriate threshold.

13. The integrated circuit of claim 12 wherein a first ion implantation operation sets the threshold for a high voltage MOS transistor with a standard threshold voltage.

14. The integrated circuit of claim 12 wherein a second ion implantation operation sets the threshold for a zero threshold high voltage MOS transistor.

15. The integrated circuit of claim 1 wherein a threshold setting implant is applied to the channel regions of the charge retaining transistors of the NAND and NAND-based NOR memory arrays.

16. The integrated circuit of claim 8 wherein a high voltage thick insulation layer is grown in the area for the logic circuits and linear analog circuits and the peripheral circuits for the nonvolatile memory circuits.

17. The integrated circuit of claim 16 wherein the high voltage thick insulation layer is a nitride insulation layer grown on the surface of the substrate.

18. The integrated circuit of claim 16 wherein a tunneling insulation layer is formed over the area of the charge retaining transistors of the nonvolatile memory circuits.

19. The integrated circuit of claim 18 wherein the tunneling insulation layer is a tunneling oxide.

20. The integrated circuit of claim 18 wherein a first conductive layer is formed on the substrate above the tunnel insulation layer and the thick insulation layer.

21. The integrated circuit of claim 20 wherein the first conductive layer is a first polycrystalline silicon layer.

22. The integrated circuit of claim 20 wherein the first conductive layer is patterned to define a floating gate for each of the floating gate charge retaining transistors.

23. The integrated circuit of claim 20 wherein a nitride layer and a second oxide layer are formed on the tunneling oxide layer to form an oxide-nitride-oxide (ONO) charge retaining layer.

24. The integrated circuit of claim 20 wherein an active area mask defines areas of the shallow trench isolation to separate the area of the nonvolatile memory array circuits, the logic circuits and the linear analog circuits.

25. The integrated circuit of claim 24 wherein the defined areas of the active area mask are etched to create the trenches and then filled with trench insulation.

26. The integrated circuit Of claim 25 wherein the trench insulation is a silicon oxide.

27. The integrated circuit of claim 25 the shallow trench isolation self-aligns the charge retaining regions of the charge retaining transistors.

28. The integrated circuit of claim 27 wherein the shallow trench isolation provides the self alignment of the first conductive layer to improve performance of the charge retaining transistors.

29. The integrated circuit of claim 22 wherein an inter-level dielectric layer is formed on the first conductive layer.

30. The integrated circuit of claim 29 wherein the inter-level dielectric layer is an oxide-nitride-oxide (ONO) layer formed by a high temperature chemical vapor deposition.

31. The integrated circuit of claim 29 wherein the inter-level dielectric is then etched in the active areas for peripheral circuitry of the nonvolatile memory array circuits, the logic circuits, and the linear circuits.

32. The integrated circuit of claim 16 wherein the high voltage thick insulation is removed in the active areas for peripheral circuitry of the nonvolatile memory array circuits, the logic circuits, and the linear circuits having the low voltage transistors and a thin gate insulation is grown in the regions defining the low voltage transistors.

33. The integrated circuit of claim 32 wherein the thin gate insulation is a silicon oxide.

34. The integrated circuit of claim 29 wherein a second conductive layer is formed on the surface of the substrate.

35. The integrated circuit of claim 34 wherein the second conductive layer is a second polycrystalline silicon that is deposited to thickness of from approximately 1,500 Å to 3,000 Å.

36. The integrated circuit of claim 35 wherein the second polycrystalline silicon conductive layer is doped with an impurity to increase the conductivity of the second polycrystalline silicon conductive layer.

37. The integrated circuit of claim 34 wherein a capping layer is deposited over the second conductive layer to prevent peeling of conductive films applied to the surface of the conductive layer to improve conductivity of the second conductive layer.

38. The integrated circuit of claim 37 wherein the conductive films are tungsten.

39. The integrated circuit of claim 34 wherein a control gate mask is applied to the second polycrystalline silicon conductive layer and the capping layer to define the control gates of the charge retaining transistors and the gates of the NMOS and PMOS transistors of the peripheral circuits for the nonvolatile memory array circuits, logic circuits and linear analog circuits.

40. The integrated circuit of claim 39 wherein a PMOS mask is formed over the regions of the PMOS transistors to protect the regions of the PMOS transistors.

41. The integrated circuit of claim 40 wherein a first lightly doped drain (LDD) implant of an impurity of the first conductivity type is applied to the surface of the substrate.

42. The integrated circuit of claim 41 wherein the first lightly doped drain implant is an arsenic implant or a phosphorus implant of a density of from approximately 1e12 to approximately 1e15.

43. The integrated circuit of claim 41 wherein an NMOS mask is placed over the regions of the NMOS transistors of the nonvolatile memory array, the peripheral circuits for the nonvolatile memory array circuits, logic circuits and linear analog circuits and a second lightly doped drain implant of an impurity of the second conductivity type is applied to the surface of the substrate.

44. The integrated circuit of claim 43 wherein the second lightly doped drain implant may be a boron implant or a boron di-flouride (BF2) implant of a density of from approximately 1e12 to approximately 1e15.

45. The integrated circuit of claim 43 wherein a peripheral implant mask is formed over the substrate leaving the nonvolatile memory array circuits exposed for a cell source and drain implant.

46. The integrated circuit of claim 45 wherein the stacked gate is self-aligning feature for a cell source/drain implant of the first conductivity type to form the source and drains for the charge retaining transistors.

47. The integrated circuit of claim 46 wherein the cell source/drain implant is preceded by a halo implant of the second conductivity type within the triple well against the junction walls to limit the extent of depletion regions.

48. The integrated circuit of claim 46 wherein a thick spacer insulation layer is formed on the surface of the substrate and then defined to form spacers adjacent to the stacked gate structure of the charge retaining transistors and the gates of the NMOS and PMOS transistors.

49. The integrated circuit of claim 48 wherein the low voltage transistors and the nonvolatile memory array circuits have a high voltage diffusion masking applied to them.

50. The integrated circuit of claim 49 wherein a double diffusion implant of the first conductivity type is applied to the high voltage transistors to form the source and drain of the high voltage transistors.

51. The integrated circuit of claim 50 wherein the double diffusion implant density is chosen such that the junction breakdown voltage is greater than approximately +20V.

52. The integrated circuit of claim 49 wherein the high voltage diffusion masking is removed and a first low voltage diffusion masking is applied to the regions of the nonvolatile memory array circuits, logic circuits and linear analog circuits having the second type conductivity and a first low voltage diffusion having a conductivity of the first type is applied to the low voltage and high voltage transistors of the first conductivity type to form a shallow junction depth for low voltage applications and for a metal contact for the high voltage transistors.

53. The integrated circuit of claim 49 wherein the high voltage transistors are covered with the first low voltage diffusion masking and upon removal of the low voltage diffusion masking from the high voltage region, a diffusion plug is created to make a contact region for the source and drains of the high voltage transistors.

54. The integrated circuit of claim 52 wherein the first low voltage diffusion masking is removed from the surface of the substrate and a second low voltage diffusion masking is applied to the high and low voltage transistors of the first conductivity type.

55. The integrated circuit of claim 54 wherein a second low voltage diffusion is applied to the area of the transistors with the second conductivity type to create the source and drains of the transistors of the second conductivity type to form a shallow junction depth for low voltage applications.

56. The integrated circuit of claim 55 wherein a second interlayer dielectric is formed on the surface of the substrate.

57. The integrated circuit of claim 56 wherein the second interlayer dielectric is a borophosphosilicate glass (BPSG) or a phosphosilicate glass (PSG) formed by chemical vapor deposition followed by a chemical mechanical planarization.

58. The integrated circuit of claim 56 wherein a photoresist layer is formed on the second interlayer dielectric and patterned to expose the drain and source regions of the charge retaining transistors and the NMOS and PMOS transistors.

59. The integrated circuit of claim 58 wherein an etching process exposes the drain and source regions of the charge retaining transistors and the NMOS and PMOS transistors.

60. The integrated circuit of claim 59 wherein contact regions are made to the sources and drains and filled with a barrier metal.

61. The integrated circuit of claim 60 wherein the barrier metal is Titanium Nitride/titanium alloy.

62. The integrated circuit of claim 61 wherein a first level metal is formed on the surface of the second interlayer dielectric.

63. The integrated circuit of claim 62 wherein the first level metal is sputtered onto the surface of the substrate or electroplated on the surface of the substrate.

64. The integrated circuit of claim 62 wherein the first level metal is aluminum or copper.

65. The integrated circuit of claim 62 wherein the first level metal is then patterned to form interconnections for the nonvolatile memory array circuits, logic circuits and linear analog circuits.

66. The integrated circuit of claim 65 wherein additional layers of the interlayer dielectric and metal conductors are formed to provide added interconnections for the nonvolatile memory array circuits, logic circuits and linear analog circuits.

* * * * *